(12) United States Patent
Maheshwari

(10) Patent No.: US 7,251,147 B1  
(45) Date of Patent: Jul. 31, 2007

(54) CONTENT COMPARATOR MEMORY (CCM) DEVICE AND METHOD OF OPERATION

(75) Inventor: Dinesh Maheshwari, Fremont, CA (US)

(73) Assignee: Netlogic Microsystems, Inc., Mountain View, CA (US)

( * ) Notice: Subject to any disclaimer, the term of this patent is extended or adjusted under 35 U.S.C. 154(b) by 47 days.

(21) Appl. No.: 11/146,639

(22) Filed: Jun. 7, 2005

(51) Int. Cl.
G11C 15/00 (2006.01)
G11C 7/00 (2006.01)

(52) U.S. Cl. ............... 365/49; 365/289.97; 365/203

(58) Field of Classification Search ............... 365/49, 365/189.07, 203
See application file for complete search history.

(56) References Cited

U.S. PATENT DOCUMENTS

| | | | |
|---|---|---|---|
| 4,975,873 A | 12/1990 | Nakabayashi et al. | |
| 5,010,516 A | 4/1991 | Oates | |
| 5,440,715 A | 8/1995 | Wyland | |
| 5,999,435 A | 12/1999 | Henderson et al. | |
| 6,081,440 A | 6/2000 | Washburn et al. | |
| 6,108,227 A | 8/2000 | Voelkel | |
| 6,240,000 B1 | 5/2001 | Sywyk et al. | |
| 6,253,280 B1 | 6/2001 | Voelkel | |
| 6,266,262 B1 | 7/2001 | Washburn et al. | |
| 6,480,406 B1 | 11/2002 | Jin et al. | |
| 6,502,163 B1 | 12/2002 | Ramankutty | |
| 6,504,740 B1 | 1/2003 | Voelkel | |
| 6,505,270 B1 | 1/2003 | Voelkel et al. | |
| 6,515,884 B1 * | 2/2003 | Sywyk et al. ................ 365/49 |
| 6,633,953 B2 | 10/2003 | Stark | |
| 6,647,457 B1 | 11/2003 | Sywyk et al. | |
| 6,661,716 B1 | 12/2003 | Sywyk et al. | |
| 6,697,275 B1 | 2/2004 | Sywyk et al. | |
| 6,697,276 B1 | 2/2004 | Pereira et al. | |
| 6,721,202 B1 | 4/2004 | Roge et al. | |
| 6,751,755 B1 | 6/2004 | Sywyk et al. | |
| 6,757,779 B1 | 6/2004 | Nataraj et al. | |
| 6,763,426 B1 | 7/2004 | James et al. | |
| 6,772,279 B1 | 8/2004 | Sun et al. | |
| 6,804,744 B1 | 10/2004 | Abbas | |
| 6,845,024 B1 | 1/2005 | Wanzakhade et al. | |
| 6,876,558 B1 | 4/2005 | James et al. | |
| 6,892,273 B1 | 5/2005 | James et al. | |
| 6,903,951 B1 | 6/2005 | James | |
| 6,906,936 B1 | 6/2005 | James | |
| 6,994,039 B1 * | 2/2006 | Beck ..................... 111/200 |

(Continued)

OTHER PUBLICATIONS

U.S. Appl. No. 10/202,526, Zou, Janet.

(Continued)

*Primary Examiner*—Son Dinh
(74) *Attorney, Agent, or Firm*—Haverstock & Owens LLP

(57) ABSTRACT

A content comparator memory (CCM) device can include a row (100) of CCM cells (102-1 to 102-I). Each CCM cell (102-1 to 102-I) can have a controllable signal path (104-1 to 104-I) arranged in series to form a match path (106) that provides a match indication MATCH that can be activated when a comparand value (CD[1:I]) is determined to match a stored data value. Each CCM cell (102-1 to 102-I) can also be commonly connected to a comparator line (110) that can provide a comparator indication CMP when a compare value (CD[1:I]) has a predetermined magnitude with respect to a stored value.

20 Claims, 13 Drawing Sheets

U.S. PATENT DOCUMENTS 7,126,834 B1 * 10/2006 Meng et al. .................. 365/49
7,133,302 B1 * 11/2006 Srinivasan et al. ........... 365/49

OTHER PUBLICATIONS

U.S. Appl. No. 10/217,746, Chou, Richard.
U.S. Appl. No. 10/264,667, James, David.
U.S. Appl. No. 10/266,953, Wanzakhade, Sanjay.
U.S. Appl. No. 10/271,660, James, David.
U.S. Appl. No. 10/281,814, James, David.
U.S. Appl. No. 10/320,053, Wanzakhade, Sanjay.
U.S. Appl. No. 10/320,588, Wanzakhade, Sanjay.
U.S. Appl. No. 10/329,146, James, David.
U.S. Appl. No. 10/746,899, Om, Hari.
U.S. Appl. No. 10/873,608, Meng, Anita X.
U.S. Appl. No. 10/940,129, Narum, Steven.
U.S. Appl. No. 10/950,323, Birman, Mark.
U.S. Appl. No. 10/977,516, Om, Hari.
U.S. Appl. No. 11/000,568, Smith, Scott.
U.S. Appl. No. 11/011,464, Smith, Scott.
U.S. Appl. No. 11/014,123, Om et al.
U.S. Appl. No. 11/043,391, Gupta, Pankaj.
U.S. Appl. No. 11/085,399, Om, Hari.
U.S. Appl. No. 11/089,837, Smith, Scott.
U.S. Appl. No. 11/090,116, Banachowicz, Bartosz.
U.S. Appl. No. 11/207,323, Venkatachary, Sriniv.
U.S. Appl. No. 60/629,694, Jiang, Bin.
U.S. Appl. No. 60,657,754, Maheshwari, Dinesh.
U.S. Appl. No. 60/661,745, Maheshwari, Dinesh.
U.S. Appl. No. 60/663,656, Maheshwari, Dinesh.
U.S. Appl. No. 60/666,875, Maheshwari, Dinesh.
U.S. Appl. No. 60/667,325, Om, Hari.

* cited by examiner

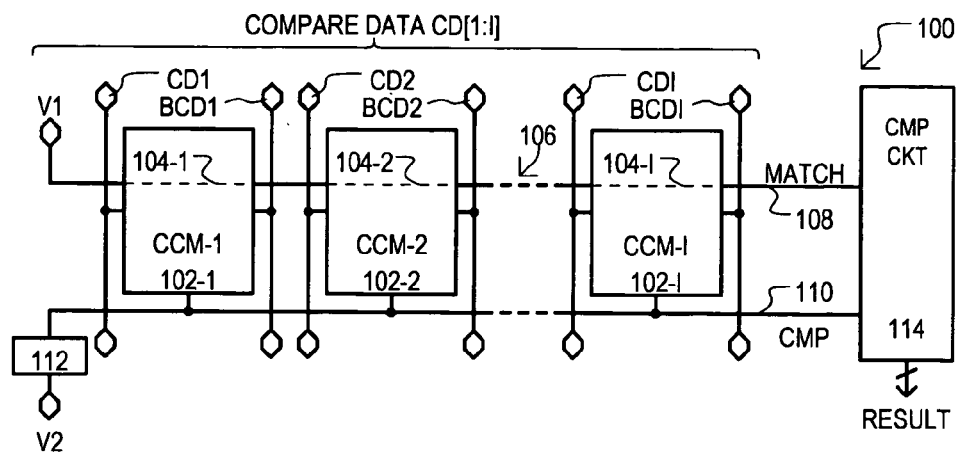
FIG. 1
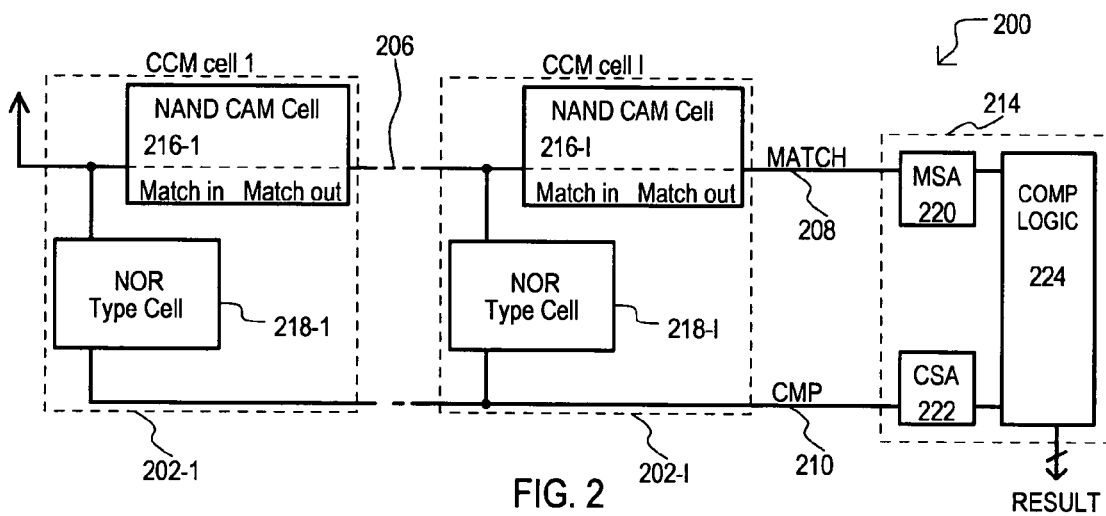
FIG. 2
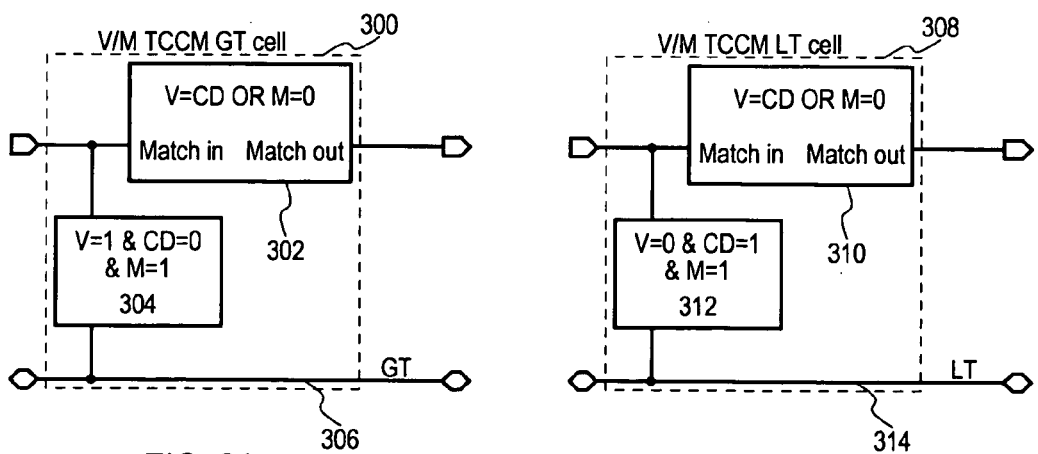
FIG. 3A                    FIG. 3B

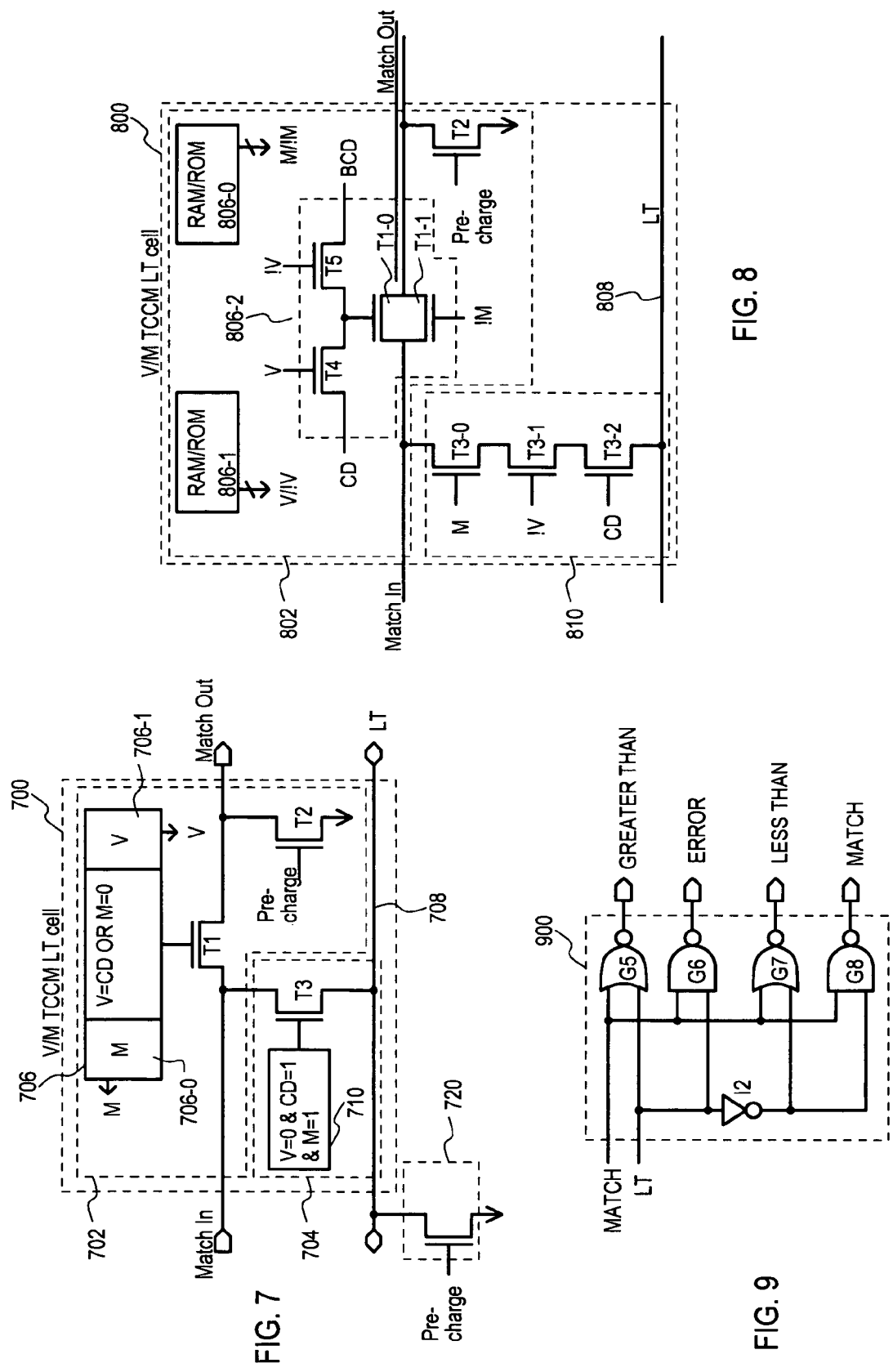

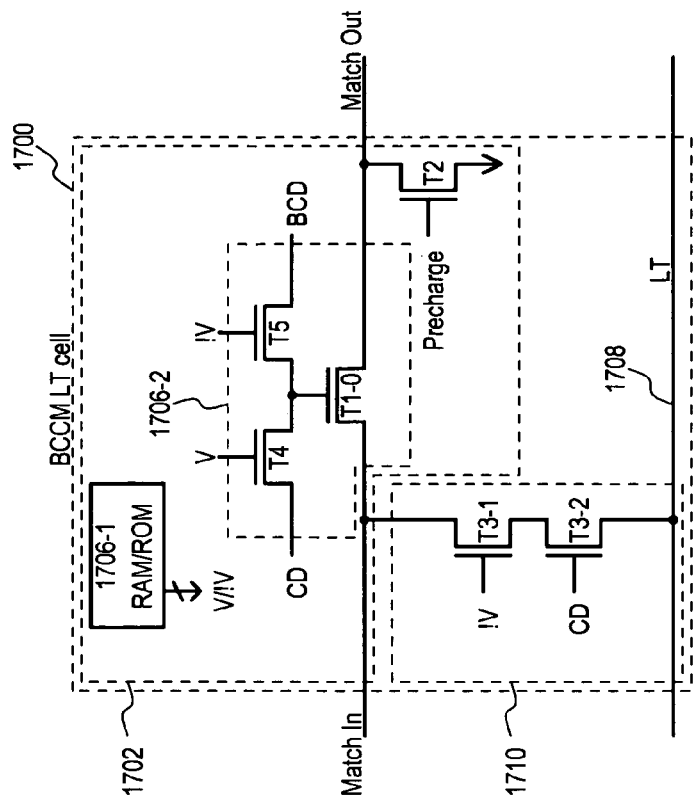
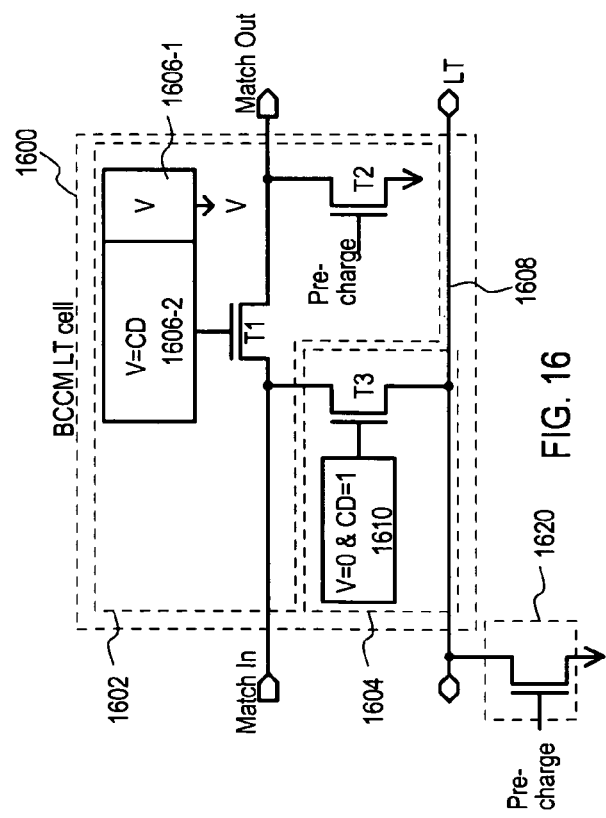

NOR CAM ROW

```
If (Precharge)
    Match = 1
else
    For each bit I in the row
        If M(I) = 1 AND ( V(I) != CompareData (I)) then
            Match = 0
```

FIG. 18 (BACKGROUND ART)

NAND CAM ROW

```
If (Precharge)
    For each bit I in the row
        MatchOut(I) = 0
Else
    For each bit I in the row (I=0, I < Wordwidth, I++)
        If M(I) = 0 OR V(I) = CompareData(I) then
            MatchOut(I) = MatchOut (I-1)
    Match = MatchOut (Wordwidth -1)
```

FIG. 19 (BACKGROUND ART)

V/M TCCM GT ROW

```
If (Precharge)
    For each bit I in the row
        MatchOut(I) = 0
    GreaterThan = 0
Else
    For each bit I in the row
        If M(I) = 0 OR V(I) = CompareData(I) then
            MatchOut(I) = MatchOut (I-1)
        Else if (M(I) = 1 AND V(I) > CompareData(I) AND MatchOut (I-1) = 1) then
            GreaterThan = 1
Match = MatchOut(Wordwidth-1)
LessThan = !Match AND !GreaterThan
```

FIG. 20A-1

V/M TCCM GT ROW

```
If (Precharge)
    For each bit I in the row
        MatchOut(I) = 0
    GreaterThan = 0
Else
    For each bit I in the row
        If M(I) = 0 OR V(I) = CompareData(I) then
            MatchOut(I) = MatchOut (I-1)
        Else if (M(I) = 1 AND V(I) > CompareData(I)) then
            GreaterThan = MatchOut (I-1) OR GreaterThan
Match = MatchOut(Wordwidth-1)
LessThan = !Match AND !GreaterThan
```

FIG. 20A-2

V/M TCCM LT ROW

```
If (Precharge)
    For each bit I in the row
        MatchOut(I) = 0
    LessThan = 0
Else
    For each bit I in the row
        If M(I) = 0 OR V(I) = CompareData(I) then
            MatchOut(I) = MatchOut (I-1)
        Else if (M(I) = 1 AND V(I) < CompareData(I)) then
            LessThan = MatchOut (I-1) OR LessThan
Match = MatchOut(Wordwidth-1)
GreaterThan = !Match AND !LessThan
```

FIG. 20B

X/Y TCCM GT ROW

```
If (Precharge)
    For each bit I in the row
        MatchOut(I) = 0
    GreaterThan = 0
Else
    For each bit I in the row
        If X(I)=Y(I)=0 OR !X(I)=Y(I) = CompareData(I) then
            MatchOut(I) = MatchOut (I-1)
        Else if (!X(I)=Y(I) AND Y(I) > CompareData(I)) then
            GreaterThan = MatchOut (I-1) OR GreaterThan
Match = MatchOut(Wordwidth-1)
LessThan = !Match AND !GreaterThan
```

FIG. 20C

X/Y TCCM LT ROW

```
If (Precharge)
    For each bit I in the row
        MatchOut(I) = 0
    LessThan = 0
Else
    For each bit I in the row
        If X(I)=Y(I)=0 OR !X(I)=Y(I) = CompareData(I) then
            MatchOut(I) = MatchOut (I-1)
        Else if (!X(I)=Y(I) AND Y(I) < CompareData(I) then
            LessThan = MatchOut (I-1) OR LessThan
Match = MatchOut(Wordwidth-1)
GreaterThan = !Match AND !LessThan
```

FIG. 20D

BCCM GT ROW

```
If (Precharge)
    For each bit I in the row
        MatchOut(I) = 0
    GreaterThan = 0
Else
    For each bit I in the row
        If V(I) = CompareData(I) then
            MatchOut(I) = MatchOut (I-1)
        Else if V(I) > CompareData(I) then
            GreaterThan = MatchOut (I-1) OR GreaterThan
Match = MatchOut(Wordwidth-1)
LessThan = !Match AND !GreaterThan
```

FIG. 20E

BCCM LT ROW

```
If (Precharge)
    For each bit I in the row
        MatchOut(I) = 0
    LessThan = 0
Else
    For each bit I in the row
        If V(I) = CompareData(I) then
            MatchOut(I) = MatchOut (I-1)
        Else if V(I) < CompareData(I) then
            LessThan = MatchOut (I-1) OR LessThan
Match = MatchOut(Wordwidth-1)
GreaterThan = !Match AND !LessThan
```

FIG. 20F

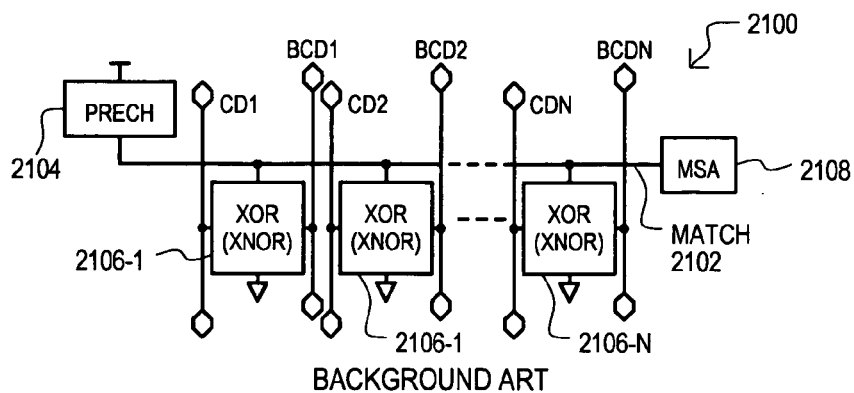
FIG. 21 BACKGROUND ART
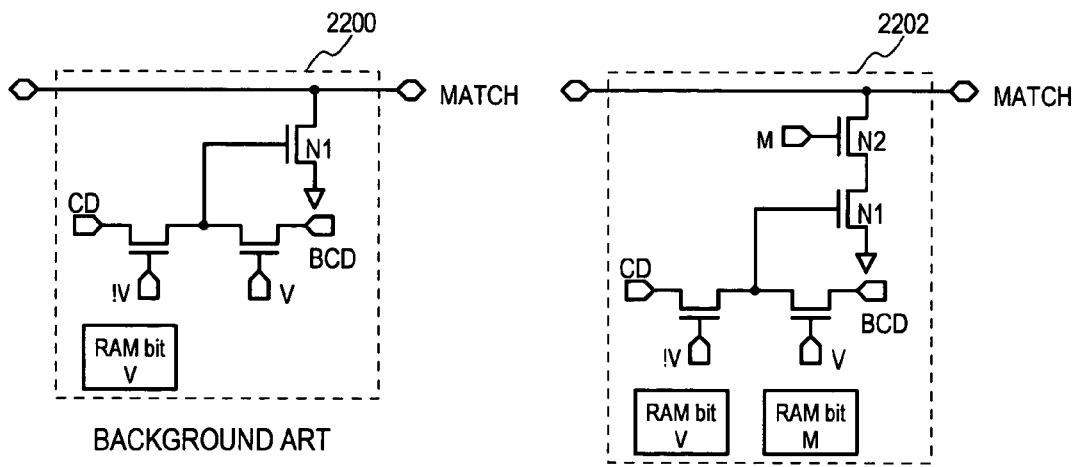
FIG. 22A BACKGROUND ART
FIG. 22B BACKGROUND ART
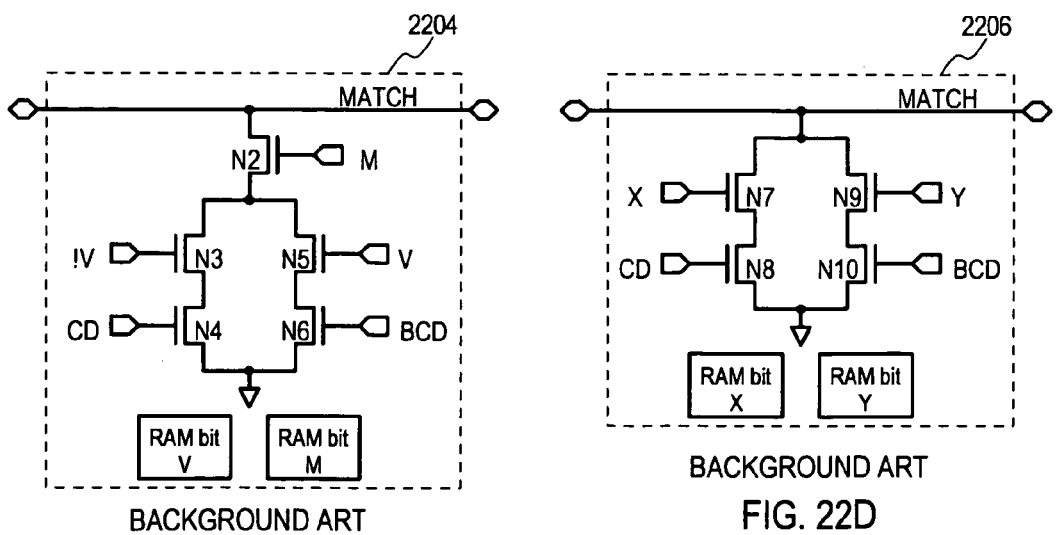
FIG. 22C BACKGROUND ART
FIG. 22D BACKGROUND ART

CONTENT COMPARATOR MEMORY (CCM) DEVICE AND METHOD OF OPERATION

TECHNICAL FIELD

The present invention relates generally to memory devices, and more particularly to memory devices that provide comparison of entry values with an applied comparand value, such as content addressable memory (CAM) devices.

BACKGROUND OF THE INVENTION

While typically memory devices, such as random access memories (RAMs) and read only memories (ROMs) access single entries according to an applied addresses, other types of memory devices can provide a matching function with respect all entries in a device. One such type of a memory device is the content addressable memory (CAM) device.

Conventional CAM devices can store a number of data values, each in one entry. Data values stored in the entries may then be compared to an applied comparand value (also referred to as a key) to generate a match indication. The relatively rapid speed at which CAM devices can compare multiple entries to an applied comparand value has resulted in CAMs enjoying widespread use in various applications, such as packet processing, as but one example. A match indication generated by a conventional CAM device can typically take only one of two possible results: match (HIT) or no match (MISS).

Conventional CAM devices include both binary CAM devices and ternary CAM devices. Conventional binary CAM devices typically include entries that can each store a data value having a number of data bits. In most cases, a match indication can be generated when all bits of a comparand value match all the bits of an entry. Thus, a conventional binary CAM device can include a number of binary CAM cells, each of which can operate to provide, on a bit-wise basis, a bit compare result of equal "=" (stored data bit "V" matches corresponding compare data bit "CD") or not equal "!=" (stored data bit "V" matches corresponding compare data bit CD).

Conventional ternary CAM devices may typically include entries having data bits, some or all of which may be masked from a compare operation. Thus, a conventional ternary CAM device can include a number of ternary CAM cells, each of which can operate to provide, on a bit-wise basis, a bit compare result of "=", "!=", or "don't care" (indicate data value is equal regardless of compare data value).

To better understand various aspects of the embodiments, examples of conventional CAM devices will be now be described. Referring to FIG. 21, one general configuration for a conventional CAM device is set forth in block diagram and designated by the general reference character 2100. FIG. 21 shows a CAM device row, which can be repeated to form a CAM array with match circuits. A conventional CAM row 2100 can include a match line 2102 that can be precharged to a high potential by a precharge circuit 2104. Connected between the match line 2102 and a low voltage can be a number of CAM cells 2106-1 to 2106-N, each of which can store data bit value. Each CAM cell (2106-1 to 2106-N) can receive a corresponding comparand bit value by way of a pair of comparand lines (CD1/BCD1 to CDN/BCDN).

In operation, a match line 2102 can be precharged to a high voltage level. Then, each CAM cell (2106-1 to 2106-N) can perform an exclusive NOR type operation with respect to a stored data bit value and the corresponding comparand bit value. If a match does not exist between at least one bit, a discharge path is created through the CAM cell of the non-matching bit and the match line potential falls. This can be detected by a match sense amplifier (MSA) 2108 as a "miss". In contrast, if a match exists between all bits, no discharge path is created and the match line remains high. This can be detected by a match sense amplifier (MSA) 2108 as a "hit".

In the case of a "binary" CAM cell, bit match and misses can be based solely on a stored data bit value "V" and compare bit value "CD". In the case of "ternary" CAM cells, bit match and misses can additionally be based on a "masking" of bit values, which can force a match or miss regardless of the stored data bit value. More particularly, in the case of a valid/mask (V/M) ternary CAM cell, if a mask bit M has one value (e.g., high), bit compare result can be "always match". Similarly, in the case of an two value (X/Y) encoded ternary CAM cell, if two data bits have one value (e.g., X=Y=low), bit compare result will be "always match", but if two data bits have another value (e.g., X=Y=high), bit compare result will be "always miss".

Various examples of conventional CAM cells that provide an XNOR/XOR type function are set forth in FIGS. 22A to 22D. FIG. 22A is a schematic diagram showing one example of a conventional binary CAM cell 2200. When a compare data value (CD) matches a stored data value (V), a discharge transistor N1 can provide a low impedance path to a low supply voltage, which can pull the potential of the match line lower. Conversely, when a compare data value (CD) matches a stored data value (V), a discharge transistor N1 can have a high impedance, and hence isolate a match line from the low supply voltage.

FIG. 22B is a schematic diagram showing one example of a conventional V/M ternary CAM cell 2202. V/M ternary CAM cell 2202 operates in the same general fashion binary CAM cell 2200, with the addition of a mask transistor N2 in the discharge path. FIG. 22C is a schematic diagram showing another example of a conventional V/M ternary CAM cell 2204. V/M ternary CAM cell 2204 includes series connected transistors having gates that each receive a data bit value or its complement (V or !V) and a compare data bit value or its complement (CD or BCD).

FIG. 22D is a schematic diagram showing one example of a conventional X/Y ternary CAM cell 2206. In the arrangement of FIG. 22D, the bit combinations of X and Y yield the following results: X=0/Y=1, match CD=1; X=1/Y=0, match CD=0; X=Y=0, always match; and X=Y=1, always miss.

The above conventional examples have demonstrated a "NOR", or "wire NOR" approach to match determinations. That is, in the event a miss in any bit location generates an overall miss result for the entire entry. An alternate approach is shown in FIGS. 23 and 24.

FIG. 23 shows a conventional CAM device row, which can be repeated to form a CAM array with match circuits. A conventional CAM row 2300 can represent an AND or NAND approach to match determinations. That is, only in the event that a match occurs in every bit location will a match exist for the overall entry.

A conventional NAND CAM row approach 2300 can include a number of CAM cells 2302-1 to 2302-N arranged in series between a high supply and a match sense amplifier 2304. In operation, CAM cell (2302-1 to 2302-N) can perform an NAND type operation with respect to a stored data bit value and the corresponding comparand bit value. If a match does not exist in the cell, a high impedance path is created, preventing a high potential from propagating to match sense amplifier 2304. In contrast, if a match exists between all bits, all CAM cells (2302-1 to 2302-N) of the row can present low impedance paths allowing a high potential to propagate to sense amplifier (MSA) 2304 and be detected as a "hit".

FIG. 24 is a schematic diagram showing one example of a conventional ternary NAND type CAM cell 2400 that can be included in an arrangement like that of FIG. 23. Prior a compare operation, a precharge device N7 can preset nodes between adjacent TCAM cells to a low potential. In a compare operation, when a compare data value (CD) matches a stored data value (V) or a match bit has a particular value (e.g., M=0), a low impedance path can be created through the NAND type CAM cell 2400.

Conventional CAM devices can provide both binary and ternary matching capabilities. However, in certain applications is may be desirable to have more complex types of operations. For example, in some cases it may be desirable to determine if a given comparand value, or portion thereof, falls within a given range.

U.S. Pat. No. 7,206,212 issued on Apr. 17, 2007, titled CONTENT ADDRESSABLE MEMORY (CAM) DEVICE WITH ENTRIES HAVING TERNARY MATCH AND RANGE COMPARE FUNCTIONS, by Richard Chou, discloses a CAM that can have a value match mode and a range match mode. In a range match mode, a comparand value can be compared to an upper and lower range limit.

Co-pending U.S. patent application Ser. No. 10/180,357, titled RANGE COMPARE CIRCUIT FOR SEARCH ENGINE, by Richard Chou, discloses a range matching circuit that receives a first range value from a first range store and a second range value from a second range store, and determines if a comparand value is within such a range.

In light of the above, it would be desirable to arrive at a compact comparator memory structure that can provide compare operations beyond equal "=" and not equal Such additional capabilities may help improve processing capabilities for various applications, including but not limited to network search engines (NSEs), image processing, database search acceleration, to name but a few.

It would also be desirable if such additional compare operations could be bit maskable, in the same general fashion as a conventional ternary CAM device.

SUMMARY OF THE INVENTION

The present invention can include a memory device with at least one row of content comparator memory (CCM) cells that stores a data value. The row of CCM cells can include a comparator result line commonly coupled to each CCM cell that provides a comparison indication when the data value has a predetermined magnitude with respect to a compare data value. The row can also includes a match path formed by a series connection of match signal paths within the CCM cells. Each CCM cell can place a respective match signal path in a low impedance state based on a data value bit and corresponding compare data value bit.

According to one aspect of the embodiments, a match path through the CCM cells of the row can be coupled to a first potential node at one end, and can provide a match indication at an opposite end. The CCM row can also include a precharge circuit that selectively couples the comparator result line to a second potential node. In one arrangement, a first potential node can be a high power supply node and a second potential node can be a low power supply node.

According to another aspect of the embodiments, a comparison indication provided by a comparator line can provide a greater-than indication when the stored data value is greater than the compare value. In another arrangement, a comparison indication can provide a less-than indication when the stored data value is less than the compare value.

According to another aspect of the embodiments, each CCM cell can compare one bit of the stored data value with a corresponding bit of the compare value to provide a bit compare result.

According to another aspect of the embodiments, each CCM cell can be a ternary CCM cell that places a respective match signal path in a low impedance state based on at least two data bit values and the corresponding compare data value bit.

The present invention can also include memory device having a plurality of content comparator memory (CCM) cells. Each CCM cell can include a first storage circuit that stores a first data value bit, a first controllable impedance path arranged in series with an adjacent CCM cell, and a second controllable impedance path coupled between the first controllable impedance path and a comparator line commonly coupled to the CCM cells.

According to one aspect of the embodiments, each CCM cell can include a first bit compare circuit that compares a first data bit value and a corresponding compare value bit to generate a first bit compare result. In addition, a first controllable impedance path can be placed into a low impedance state in response to the first bit compare result.

According to another aspect of the embodiments, a first bit compare circuit can include a first match transistor having a source-drain path forming at least a portion of the first controllable impedance path. A second match transistor can have a source-drain path coupled to a gate of the first match transistor and a gate coupled to the first storage circuit. A third match transistor can have a source-drain path coupled to a gate of the first match transistor and a gate coupled to the first storage circuit.

According to another aspect of the embodiments, each CCM cell can further include at least a second storage circuit that stores a second data value bit. A fourth match transistor can have a source-drain path coupled in series with the source-drain path of the first match transistor and a gate coupled to the second storage circuit.

According to another aspect of the embodiments, each CCM cell can include at least a second storage circuit that stores a second data value bit. In addition, a first bit compare circuit can included a first match transistor having a source-drain path forming at least a portion of the first controllable impedance path, a second match transistor having a source-drain path coupled to a gate of the first match transistor and a gate coupled to the first storage circuit, and a third match transistor having a source-drain path coupled to gate of the first transistor and a gate coupled to the second storage circuit.

According to another aspect of the embodiments, each CCM cell can include a precharge circuit that couples one end of the first controllable impedance path to a voltage node in response to a precharge signal.

According to another aspect of the embodiments, a second controllable impedance path of each CCM cell can be placed into a low impedance state based on a first data value bit having a predetermined magnitude with respect to a corresponding compare value bit.

According to another aspect of the embodiments, each second controllable impedance path can include a first comparator transistor having a gate coupled to the corresponding compare value bit and a second comparator transistor having a source-drain path in series with the first comparator transistor and a gate coupled to the first storage circuit.

According to another aspect of the embodiments, each CCM cell can further include at least a second storage circuit that stores a second data value bit. In addition, each second controllable impedance path can include a third comparator transistor having a source-drain path in series with the source-drain paths of the first and second comparator transistors, and a gate coupled to the second storage circuit.

The present invention can also include method for providing comparator results in a memory device. The method can include comparing a different compare value bit with a corresponding data value bit in a corresponding content comparator memory (CCM) cell. A match signal path can be enabled or disabled through each CCM cell based on at least a matching compare result between the compare value bit and corresponding data value bit. A comparator signal path, between a comparator line and the match signal path, can be enable or disabled based on a predetermined magnitude relationship between the compare value bit and data value bit.

According to one aspect of the embodiments, a method can also include arranging the CCM cells in series according to a predetermined significance with respect to one another. A first potential can be applied to one end of the match signal path of a most significant CCM cell, and a comparator line can be precharged to a second potential prior to comparing the compare value bits with the corresponding data value bits.

According to another aspect of the embodiments, a predetermined magnitude relationship can be selected from the group consisting of "greater than" and "less than".

According to another aspect of the embodiments, enabling or disabling a match signal path can be based on both the compare result between the compare value bit and corresponding data value bit and a mask status for the CCM cell. In addition, enabling or disabling a comparator signal path can be based on the predetermined magnitude relationship between the compare value bit and data value bit and also the mask bit value for the CCM cell.

BRIEF DESCRIPTION OF THE DRAWINGS

FIG. 1 is a block schematic diagram of a content comparator memory (CCM) row according to a first embodiment of the present invention.

FIG. 2 is a block schematic diagram of a CCM row according to a second embodiment of the present invention.

FIGS. 3A to 3F are block schematic diagrams showing various examples of CCM cells according to embodiments of the present invention.

FIGS. 7 and 8 are block schematic diagrams of other V/M TCCM cells according to embodiments of the present invention.

FIG. 9 is a block schematic diagram of a "less-than" compare result circuit according to another embodiment.

FIGS. 14 to 17 are block schematic diagrams of binary CCM (BCCM) cells according to embodiments of the present invention.

FIGS. 18 and 19 show conventional methods for NOR and NAND CAM rows.

FIGS. 20A-1 to 20F show methods for CCM rows according to various embodiments.

FIG. 21 is a block schematic diagram showing a conventional NOR type CAM match approach.

FIGS. 22A to 22D are schematic diagrams showing examples of conventional CAM cells that can be used in a NOR type CAM match approach.

DETAILED DESCRIPTION

Figure 3C:
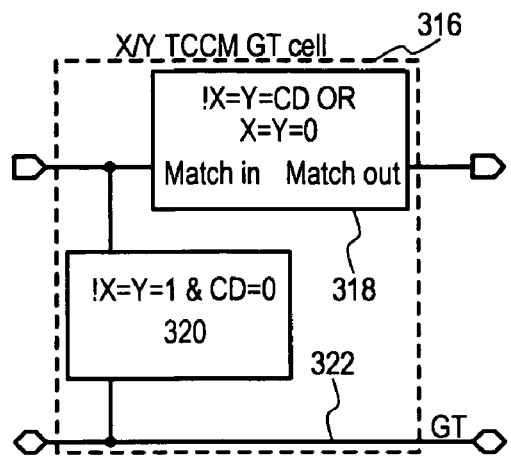

Various embodiments of the present invention will now be described in detail with reference to a number of drawings. The embodiments include a novel memory device, memory cell, and method of operation that can provide for equal "=" (hit) and not equal "!=" (miss) results between a stored data value and comparand value, and in addition, can provide range compare results, including but not necessarily limited to: greater than ">", greater-than-or-equal-to "≧", less than "<", or less-than-or-equal-to "≦". A memory device according to the various disclosed embodiments will be referred to as a "content comparator memory" (CCM) device. Similarly, memory cells of such a device will be referred to as CCM cells.

A CCM device according to a first embodiment is shown by FIG. 1 in a block schematic diagram. FIG. 1 shows a CCM row 100 that can be repeated to form a CCM memory device. A CCM row 100 can include a number of CCM cells 102-1 to 102-I, each of which can store one or more bits of a data value for comparison with corresponding bit(s) of a compare data value (i.e., a comparand). Each CCM cell (102-1 to 102-I) of the same row can have a significance with respect to one another. In the example of FIG. 1, CCM cell 102-1 has the highest significance (stores a most significant bit MSB) and significance lessens going from left to right. Thus, CCM cell 102-I has the lowest significance (stores a least significant bit LSB). It follows that in FIG. 1, for compare data value (CD[1:I]), bit value CD1 is a MSB, while CDI is an LSB.

Each CCM cell (102-1 to 102-I) of a same row can have a controllable signal path (104-1 to 104-I) arranged in series to form a match path 106. A match path 106 can have one end connected to a first voltage node V1 and another end connected to a match output 108. A match output 108 can provide a match indication MATCH that can be activated when a comparand value (CD[1:I]) is determined to match a stored data value. It is understood a "match" determination may or may not include selective masking of bit values (i.e., the CCM device can be either ternary or binary in operation).

Each CCM cell (102-1 to 102-I) of a same row can also be commonly connected to a comparator line 110. A comparator line 106 can provide a comparator indication CMP that can be activated when a compare value (CD[1:I]) has a predetermined magnitude with respect to a stored value. As but two example, such a magnitude can be "greater-than"

(e.g., data value greater than compare value) or "less-than" (e.g., data value less than compare value). Still further, as in the case of match indication MATCH, a comparison indication CMP may or may not be generated by masking of data bit values. A comparator line 110 can be selectively connected to a second voltage V2 by a precharge circuit 112.

In the embodiment of FIG. 1, a CCM device row 100 can further include a compare circuit 114. A compare circuit 114 can receive a match indication MATCH and comparator indication CMP, and generate a compare result RESULT. A compare result RESULT can include any of "=" (data value stored in CCM cells determined to match compare data value), "!=" (data value stored in CCM cells determined not to match compare data value), ">" (data value stored in CCM cells determined to be greater than compare data value), "≧" (data value stored in CCM cells determined to be greater than or equal to compare data value), "<" (data value stored in CCM cells determined to be less than compare data value), and "≦" (data value stored in CCM cells determined to be less than or equal to compare data value).

In this way, a row of CCM cells can generate both a match indication MATCH from a match path 106 that extends through each CCM cell of a row, as well as a comparator indication CMP from a comparator line 110 common to all CCM cells. From such two determinations, numerous range match results can be generated.

Referring now to FIG. 2, a second embodiment is set forth in a block schematic diagram and designated by the general reference character 200. A second embodiment can be row of CCM cells, and can be considered related to the first embodiment in that it can represent a more detailed version of a first embodiment.

A second embodiment 200 can include a number of CCM cells (202-1 to 202-I), including a most significant CCM cell 202-1 and least significant CCM cell 202-I. Each CCM cell (202-1 to 202-I) can include a NAND CAM cell section (referred to herein as a NAND section) 216-1 to 216-I and NOR type cell section (referred to herein as a NOR section) 218-1 to 218-I.

Each NAND section (216-1 to 216-I) can provide a controllable impedance path between an input "Match in" and output "Match out" and be arranged in series between a high supply voltage VCC and a match output 208. Thus, a series arrangement of NAND sections (216-1 to 216-I) can provide a match path 206. Each NAND section (216-1 to 216-I) can operate in the same general fashion as a conventional NAND type CAM cell described above. That is, for each NAND section (216-1 to 216-I), if a data bit value of the CCM cell is determined to match a corresponding compare value bit and/or is masked, NAND section (216-1 to 216-I) can provide a low impedance path between "Match in" and output "Match out". Thus, if a data value stored in CCM cells of row 200 is determined to match a compare data value, a high power supply voltage VCC can propagate along match path 206 to match output 208. This can cause the potential of match indication MATCH to rise, which can indicate a "hit".

As in the case of the embodiment of FIG. 1, NAND sections can operate in a binary or ternary fashion.

Each NOR section (218-1 to 218-I) can be arranged between a match input (Match In) of a NAND section (216-1 to 216-I) and a comparator line 210. Each NOR section (218-1 to 218-I) can provide an impedance path controlled according to a predetermined magnitude relationship between a data value stored in the CCM cell and a corresponding compare data value bit. Such a predetermined magnitude comparison can include greater-than or less-than. Even more particularly, in a greater-than arrangement, a NOR section (218-1 to 218-I) can provide a low impedance path when a stored data value bit is a "1" and a corresponding compare data value bit is a "0". In a less-than arrangement, a NOR section (218-1 to 218-I) can provide a low impedance path when a stored data value bit is a "0" and a corresponding compare data value bit is a "1".

Like NAND sections (216-1 to 216-I), NOR sections (218-1 to 218-N) can operate in a binary or ternary fashion. In the ternary case, if a NOR section (218-1 to 218-I) is in a masked state, it can present a high impedance regardless of the data value bit or compare value bit. In this way, provided a high supply voltage has propagated to the match input of the CCM cell, if the appropriate magnitude determination is made, a comparator line 210 can be coupled to high voltage VCC via more significant CCM cells. This can cause the potential of comparator indication MATCH to rise, signifying a particular magnitude determination (e.g., greater-than or less-than).

In the particular embodiment of FIG. 2, a compare circuit 214 can include a match sense amplifier (MSA) 220, a comparator sense amplifier (CSA) 222, and compare logic 224. A MSA 220 can determine when a match indication MATCH is active. Similarly, a CSA 222 can determine when a comparator indication CMP is active. Compare logic 224 can output signals from MSA 220 and/or CSA 222, and/or may logically combine such indications to generate additional result values.

In the very particular example shown, MSA 220 and CSA 222 can detect a signal that is activated when it transitions from low to high. However, one skilled in the art would understand that in alternate arrangements, such circuits can signals activated in a different fashion (e.g., high-to-low).

CCM cells according to the various embodiments can take a variety of forms. A few of the possible examples will be described in more detail with respect to FIGS. 3A to 3F. The various CCM cells disclosed in FIGS. 3A to 3F can be considered related the embodiments of FIGS. 1 and 2, in that such cells can be used as CCM cells in the row arrangements shown.

FIG. 3A shows one example of CCM cell that can provide a "greater-than" indication and masking according to a mask bit M. Thus, CCM cell 300 can be considered a value/mask ternary CCM cell that generates a greater-than comparison result (V/M TCCM GT cell). In such an arrangement, a NAND portion 302 can provide a low impedance path in the event a stored data value bit (V) matches a compare value bit (CD) or a mask bit (M) has a particular value (in this case 0). Thus, NAND portion 302 can operate according to the function V=CD OR M=0. NOR portion 304 can provide a low impedance path according to the function V=1 & CD=0 & M=1 (where "&" is a logical AND). Thus, if a match input "Match in" is high and NOR portion 304 provides a low impedance path, a greater-than comparator indication GT on a comparator line 306 can be driven high.

FIG. 3B shows one example of CCM cell 308 that can be a V/M TCCM cell that generates a less-than comparison result (V/M TCCM LT cell). In such an arrangement, a NAND portion 310 can operate in the same fashion as NAND portion 302 of FIG. 3A. NOR portion 312 can provide a low impedance path according to the function V=0 & CD=1 & M=1. Thus, if a match input "Match in" is high and NOR portion 312 provides a low impedance path, a less-than comparator indication LT on a comparator line 314 can be driven high.

It is understood that in the embodiments of FIGS. 3A and 3B, NAND portions (302/310) and/or NOR portions (304/312) can store a data value bit "V" and mask bit "M".

FIG. 3C shows one example of CCM cell that can provide a "greater-than" indication and masking according to an alternate ternary configuration that utilizes two bits X and Y. That is, ternary operations are provided in the same general fashion as an X/Y TCAM cell. One example of a X/Y TCAM operation is shown in a table below:

| X | Y | Operation |
|---|---|---|
| 0 | 0 | Force Match (match CD = 0 or 1) |
| 0 | 1 | Match CD = 1 |
| 1 | 0 | Match CD = 0 |
| 1 | 1 | Force Miss |

The particular CCM cell 316 of FIG. 3C can be considered an X/Y TCCM GT cell. A NAND portion 318 can provide a low impedance path based on the function !X=Y=CD OR X=Y=0. NOR portion 320 can provide a low impedance path according to the function !X=Y=1 & CD=0. Thus, if "Match in" is high and NOR portion 320 provides a low impedance path, a greater-than comparator indication GT on a comparator line 322 can be driven high.

Figure 3D:
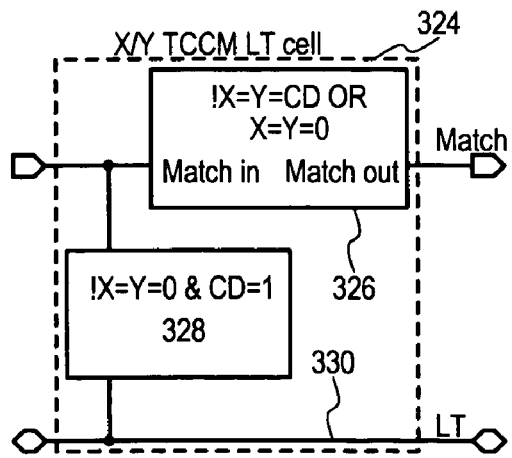

FIG. 3D shows one example of CCM cell 324 that can be an X/Y TCCM cell that generates a less-than comparison result (X/Y TCCM LT cell). In such an arrangement, a NAND portion 324 can operate in the same fashion as NAND portion 318 of FIG. 3C. NOR portion 312 can provide a low impedance path according to the function !X=Y=0 & CD=1.

It is understood that in the embodiments of FIGS. 3C and 3D, NAND portions (318/326) and/or NOR portions (320/328) can store an X bit and Y bit.

Figure 3E:
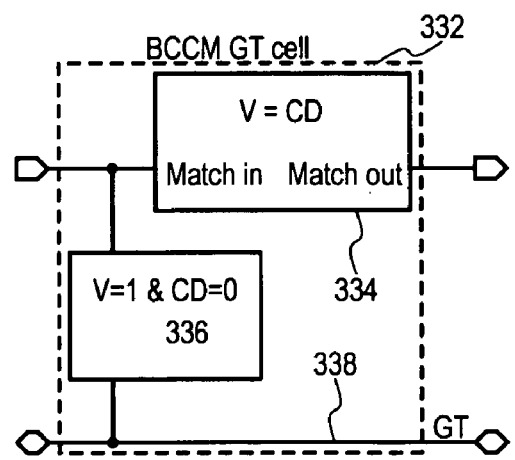
Figure 3F:
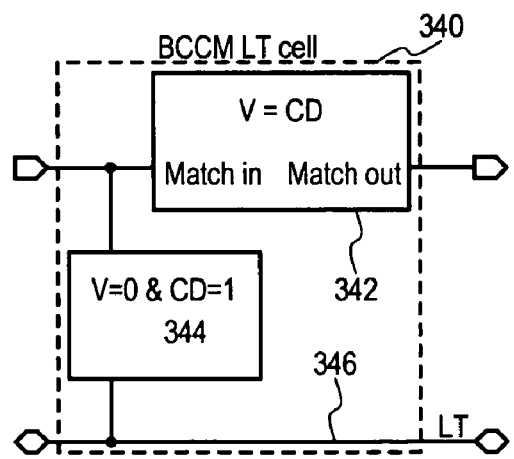

While a CCM cell can perform ternary comparison operations, in which match and magnitude comparison operations can be masked on a bit-by-bit basis, alternate embodiments can include binary CCM (BCCM) cells. FIGS. 3E and 3F show two possible examples of BCCM cells.

FIG. 3E shows one example of a BCCM cell that can provide a "greater-than" indication (BCCM GT cell). In such an arrangement, a NAND portion 332 can provide a low impedance path in the event a stored data value bit (V) matches a compare value bit (CD). NOR portion 336 can provide a low impedance path according to the function V=1 & CD=0. Thus, if a match input "Match in" is high and NOR portion 336 provides a low impedance path, a greater-than comparator indication GT on a comparator line 338 can be driven high.

FIG. 3F shows one example of BCCM cell 340 that can generate a less-than comparison result (BCCM LT cell). In such an arrangement, a NAND portion 342 can operate in the same fashion as NAND portion 334 of FIG. 3E. NOR portion 344 can provide a low impedance path according to the function V=0 & CD=1. Thus, if a match input "Match in" is high and NOR portion 344 provides a low impedance path, a less-than comparator indication LT on a comparator line 346 can be driven high.

It is understood that in the embodiments of FIGS. 3E and 3F, NAND portions (302/310) and/or NOR portions (304/312) can store a data value bit "V".

In this way, a CCM can operate in a ternary fashion or binary fashion, and can provide greater-than or less-than comparator results. Of course, FIGS. 3A to 3F represent but particular embodiments, and should not necessarily be construed as limiting to the invention.

More detailed embodiments of a V/M TCCM GT cell and memory device will now be described with reference to FIGS. 4 to 6. The embodiments of FIGS. 4–6 can be considered related to FIGS. 1–2 and 3A, in that the TCCM cells and match logic can be a more detailed versions of structures shown in such previous embodiments.

Figure 4:
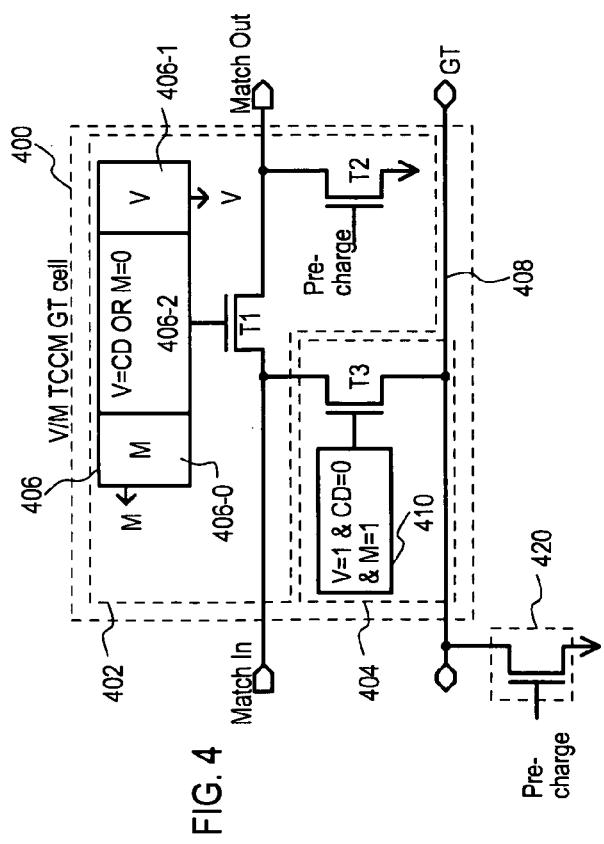

FIG. 4 is a block schematic diagram of a TCCM cell 400 and precharge circuit 420. A TCCM cell 400 can include a NAND portion 402 and NOR portion 404. A NAND portion 402 can include a match transistor T1 having a source-drain path connected between Match In and Match Out nodes, and a gate connected to a compare/store circuit 406. A compare/store circuit 406 can include a first storage circuit 406-0, second storage circuit 406-1, and a compare circuit 406-2. A first storage circuit 406-0 can store a mask bit M, and provide such a value to compare circuit 406-2 and NOR portion 404. Similarly, a second storage circuit 406-1 can store a data value bit V, and provide such a value to compare circuit 406-2 and NOR portion 404.

Compare circuit 406-2 can enable a match path transistor T1 according to the function V=CD OR M=0. That is, if either condition exists, a voltage can be applied to the gate of match path transistor T1 that results in a relatively low impedance source-drain path. A NAND portion 402 can also include a precharge device T2. A precharge device can precharge a Match Out node prior to a compare operation. In the very particular example of FIG. 4, a precharge device can precharge a Match Out node to a low supply potential.

A NOR portion 404 can include a comparator transistor T3 having a source-drain path connected between a Match In node and a greater-than (GT) comparator line 408, and a gate connected to a comparator circuit 410. A comparator circuit 410 can enable comparator transistor T3 according to the function V=1 & CD=0 & M=1. That is, if all such conditions exist, a voltage can be applied to the gate of comparator transistor T3 that results in a relatively low impedance source-drain path.

A precharge circuit 420 can include a transistor having a source-drain path coupled between GT comparator line 408 and a precharge potential, which in this example can be a low supply potential. It is understood that while a precharge device T2 may be repeated in each NAND portion of a TCCM, there may only be one precharge circuit 420 for a row of TCCM cells (or per comparator line).

Figure 5:
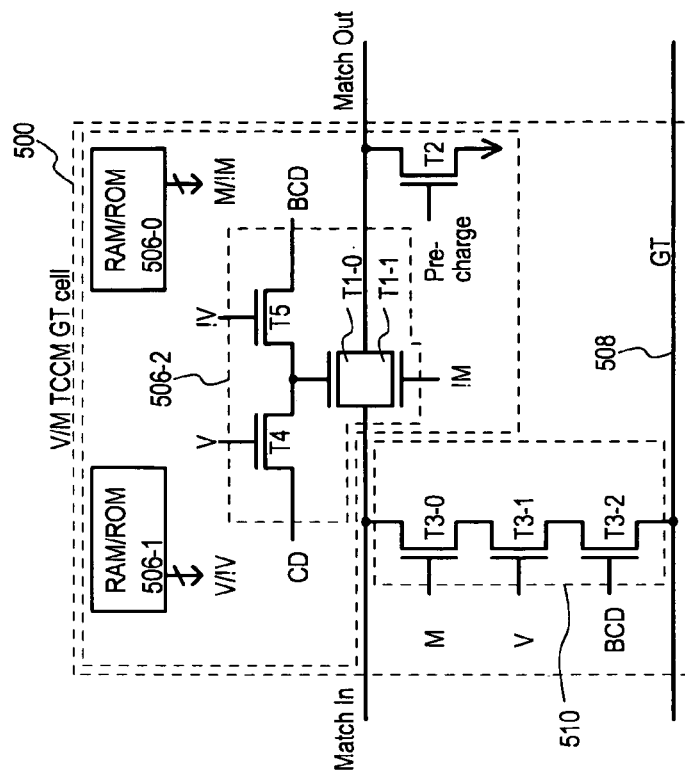
FIGS. 4 and 5 are block schematic diagrams of value/mask (V/M) ternary CCM (TCCM) cell according to embodiments of the present invention.

FIG. 5 is a block schematic diagram of a V/M TCCM GT cell 500 according to another embodiment. FIG. 5 can include some of the same general circuit sections as FIG. 4. However in the particular arrangement of FIG. 5, a first storage circuit 506-0 and second storage circuit 506-1 can be random access memory (RAM) or read-only-memory (ROM) type cells, preferably static RAM cells. Such storage circuits (506-0 or 506-1) can provide complementary mask values M/!M and data value bits V/!V.

In the arrangement of FIG. 5, a compare circuit 506-2 can include transistors T1-0, T1-1, T4 and T5. Transistors T1-0 and T1-1 can have source-drain paths connected in parallel with one another between Match In and Match Out nodes. A gate of transistor T1-1 can receive a complementary mask bit value !M. Transistors T4 and T5 can have source-drain paths connected to the gate of transistor T1-0. Transistor T4 can have a gate that receives a data bit value V and a source/drain that receives a compare data value CD. Transistor T5 can have a gate that receives a complementary data bit value !V and a source/drain that receives a complementary compare data value BCD. In such an arrangement, when a compare value bit matches a stored data bit (V=CD), transistor T1-0 can provide a low impedance path between Match In and Match Out nodes. Further, when a match bit has a particular value (M=0), transistor T1-1 can provide a low impedance path between Match In and Match Out nodes.

FIG. 5 also shows a comparator circuit 510 that includes transistors T3-0, T3-1 and T3-2 having source-drain paths arranged in series with one another between a Match In node and a GT comparator line 508. Gates of transistors T3-0, T3-1, and T3-2 can receive a mask bit value M, stored data bit V and complementary compare value bit BCD, respectively. In such an arrangement, when a stored data value bit V is greater than a compare value bit CD (e.g., V=1, CD=0, BCD=1), and masking is not in effect (M=1), a low impedance path can be created between GT comparator line 508 and a Match In node.

Figure 6:
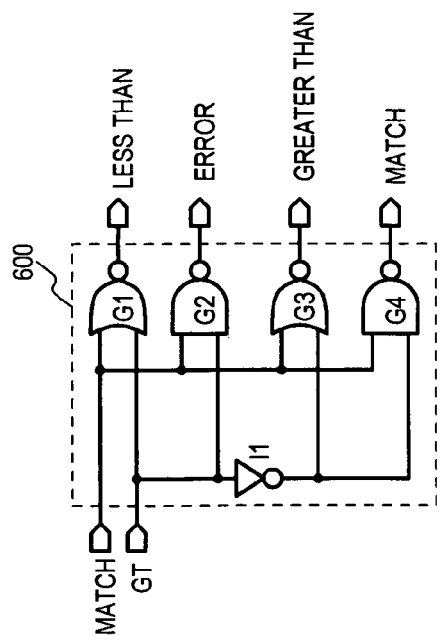
FIG. 6 is a block schematic diagram of a "greater-than" compare result circuit according to an embodiment.

FIG. 6 is a schematic diagram of compare logic 600 that can be used with a row of greater-than type CCM cells. As shown, compare logic 600 can receive a match indication MATCH, such as that generated by a match path as described above, and a greater-than comparator indication GT, such as that generated by a comparator line as describe above. The particular circuit assumes that both a MATCH and GT signal are active high, and have been sufficiently conditioned for full logic swings, such as with a match sense amplifier and/or comparator sense amplifier. Logic gates G1 to G4 can logically combine MATCH and GT signals to generate a comparator indications including LESS THAN, GREATER THAN and MATCH. An ERROR indication may also be generated in the event inputs have conflicting values.

One skilled in the art would recognize that a less-than-or-equal-to LTE indication can be generated by logically combining a LESS THAN indication with a MATCH indication (e.g., logical OR). Similarly, a greater-than-or-equal-to GTE indication can be generated by logically combining a GREATER THAN indication with a MATCH indication (e.g., logical OR).

More detailed embodiments of a V/M TCCM LT cell and memory device will now be described with reference to FIGS. 7 to 9. The embodiments of FIGS. 7–9 can be considered related to FIGS. 1–2 and 3B, in that the TCCM cells and match logic can be more detailed versions of structures shown in such previous embodiments.

FIG. 7 can include the same general sections as FIG. 4. Like sections are labeled with the same reference character but with the first digit being a "7" instead of a "4". The embodiment of FIG. 7 can differ from that of FIG. 4 in that a comparator circuit can enable or disable comparator transistor T3 based on the logic V=0 & CD=1 & M1, and thus is responsive to a "less-than" result.

FIG. 8 can include the same general sections as FIG. 5. Like sections are labeled with the same reference character but with the first digit being an "8" instead of a "5". The embodiment of FIG. 8 can differ from that of FIG. 5 in that gates of transistors T3-0, T3-1, and T3-2 can receive a mask bit value M, complementary stored data bit !V and compare value bit CD, respectively. In such an arrangement, when a stored data value bit V is less than a compare value bit CD (e.g., V=0, CD=1, BCD=0), and masking is not in effect (M=1), a low impedance path can be created between LT comparator line 808 and a Match In node.

FIG. 9 is a schematic diagram of compare logic 900 that can be used with a less-than type CCM cells. As shown, compare logic 900 can receive a match indication MATCH and a less-than comparator indication LT. Logic gates G5 to G8 can logically combine MATCH and GT signals to generate a comparator indications of LESS THAN, GREATER THAN, MATCH and ERROR. Such signals can be logically combined to generate LTE and/or GTE indications in the same fashion as described above with reference to FIG. 6.

More detailed embodiments of an X/Y TCCM GT cell and memory device will now be described with reference to FIGS. 10 and 11. The embodiments of FIGS. 10 and 11 can be considered related to FIGS. 1–2 and 3C, in that the TCCM cells can be more detailed versions of structures shown previous embodiments.

Figure 10:
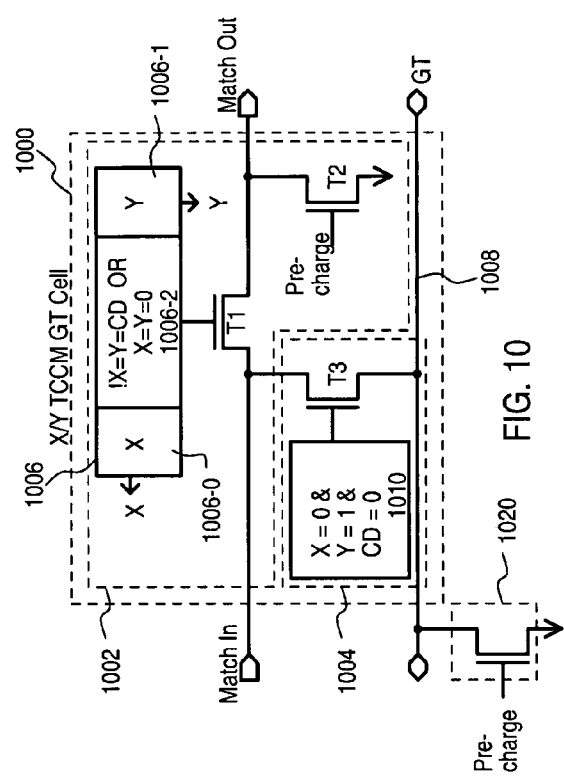

FIG. 10 can include the same general sections as FIG. 4. Like sections are labeled with the same reference character but with the first digit being a "10" instead of a "4". The embodiment of FIG. 10 can differ from that of FIG. 4 in that a first storage circuit 1006-0 can store an X bit value and a second storage circuit 1006-1 can store a Y bit value. In addition, compare circuit 1006-2 can enable or disable a match path transistor T1 according to the function !X=Y=CD OR X=Y=0, and comparator circuit 1010 can enable disable comparator transistor T3 according to the function !X=Y=1 & CD=0.

Figure 11:
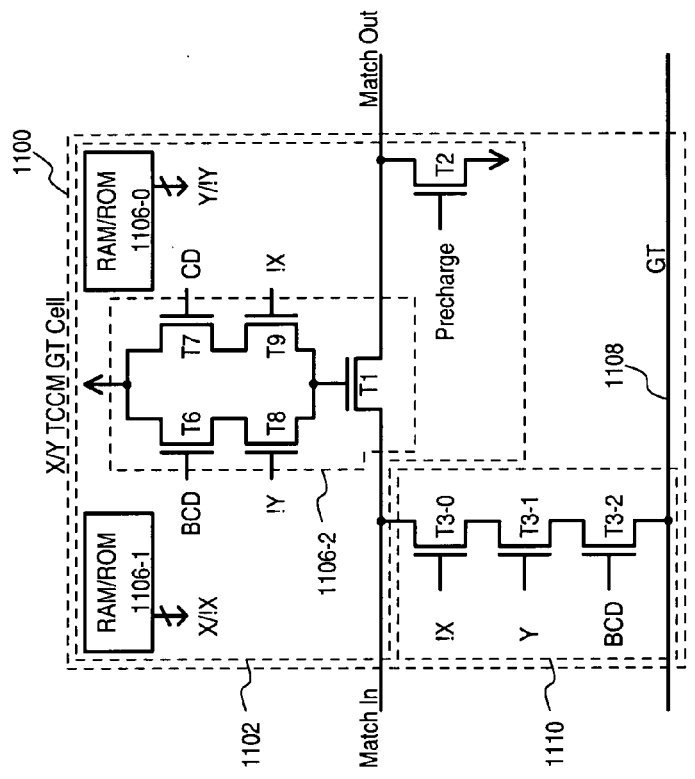
FIGS. 10 and 11 are block schematic diagrams of X/Y TCCM cells according to embodiments of the present invention.

FIG. 11 can include the same general sections as FIG. 5. Like sections are labeled with the same reference character but with the first digit being an "11" instead of a "5". The embodiment of FIG. 11 can differ from that of FIG. 5 in that a compare circuit 1106-2 can include transistors T1 and T6–T9. Transistor T1 can have source-drain paths connected between Match In and Match Out nodes. Transistors T6 and T8 can have source-drain paths arranged in series with one another between the gate of transistor T1 and a high power supply node. Gates of transistors T6 and T8 can receive a complementary compare value bit (BCD) and complementary Y bit value (!Y), respectively. In a similar fashion, Transistors T7 and T9 can have source-drain paths arranged in series with one another between the gate of transistor T1 and a high power supply node. Gates of transistors T7 and T9 can receive a compare value bit (CD) and complementary X bit value (!X). In such an arrangement, a transistor T1 can provide a low impedance path when X/Y values match a compare value (!X=Y=CD) or have a mask configuration (X=Y=0).

The embodiment of FIG. 11 can also differ from that of FIG. 5 in that a comparator circuit 1110 can include transistors T3-0, T3-1 and T3-2 with gates that receive a complementary bit value !X, a Y bit value, and a complementary compare value bit BCD, respectively.

The embodiments of FIGS. 10 and 11 can be used in conjunction with compare logic that described in conjunction with FIG. 6.

More detailed embodiments of an X/Y TCCM LT cell and memory device will now be described with reference to FIGS. 12 and 13. The embodiments of FIGS. 10 and 11 can be considered related to FIGS. 1–2 and 3D, in that the TCCM cells can be more detailed versions of structures shown in such previous embodiments.

Figure 12:
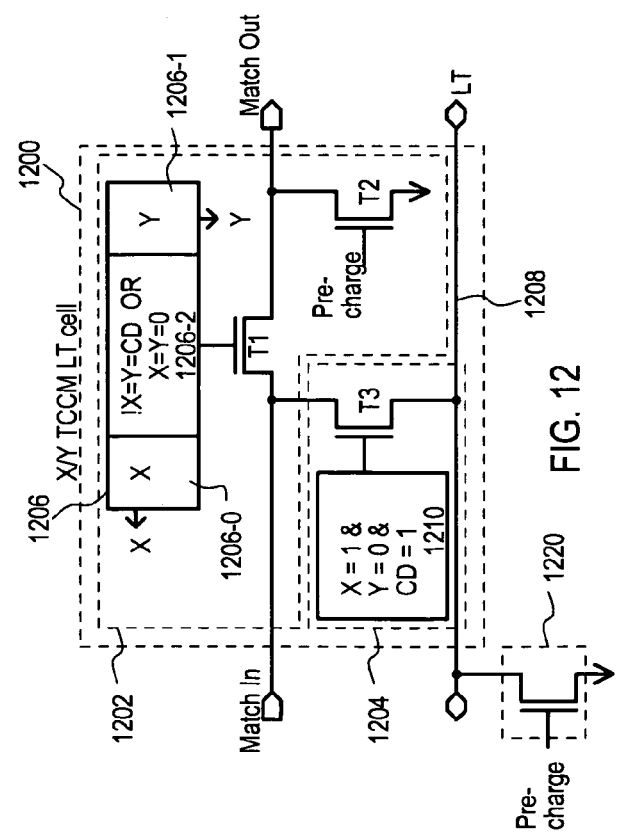

FIG. 12 can include the same general sections as FIG. 10. Like sections are labeled with the same reference character but with the first digit being a "12" instead of a "10". The embodiment of FIG. 12 can differ from that of FIG. 10 in that a comparator circuit 1210 can enable or disable comparator transistor T3 according to the function !X=Y=0 & CD=1.

Figure 13:
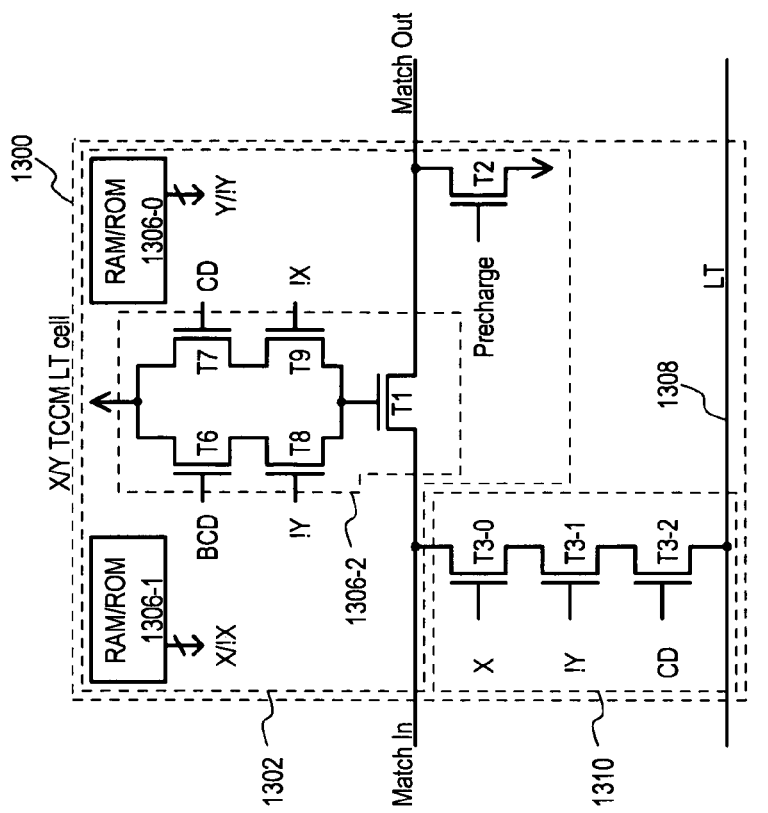
FIGS. 12 and 13 are block schematic diagrams of other X/Y TCCM cells according to embodiments of the present invention.

FIG. 13 can include the same general sections as FIG. 11. Like sections are labeled with the same reference character but with the first digit being a "13" instead of an "11". The embodiment of FIG. 13 can differ from that of FIG. 11 in that comparator circuit transistors T3-0, T3-1 and T3-2 can have gates that receive an X bit value, a complementary Y bit value! Y, and a compare value bit CD, respectively.

The embodiments of FIGS. 12 and 13 can be used in conjunction with compare logic that described in conjunction with FIG. 9.

More detailed embodiments of a binary CCM (BCCM) GT cell will now be described with reference to FIGS. 14 and 15. The embodiments of FIGS. 14 and 15 can be considered related to FIGS. 1–2 and 3E, in that the BCCM cells can be more detailed versions of structures shown in such previous embodiments.

Figure 14:
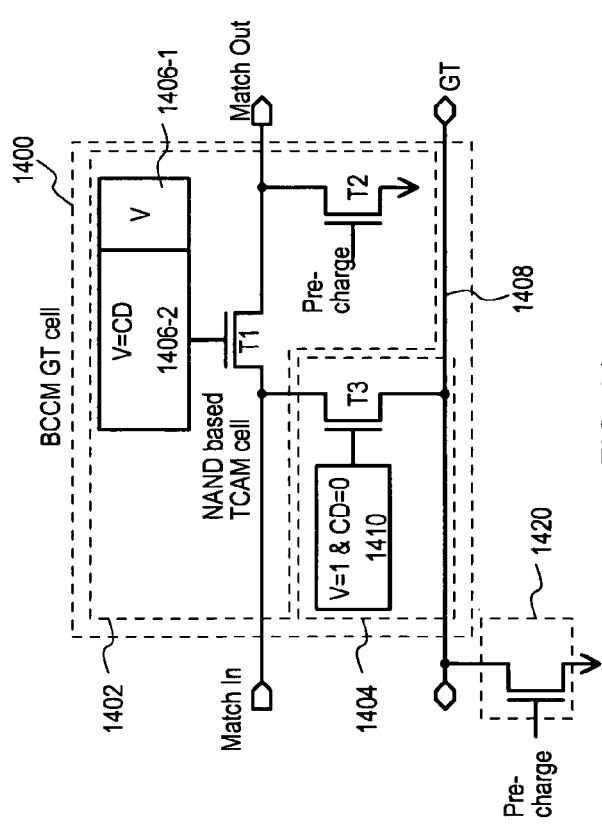
Figure 23:
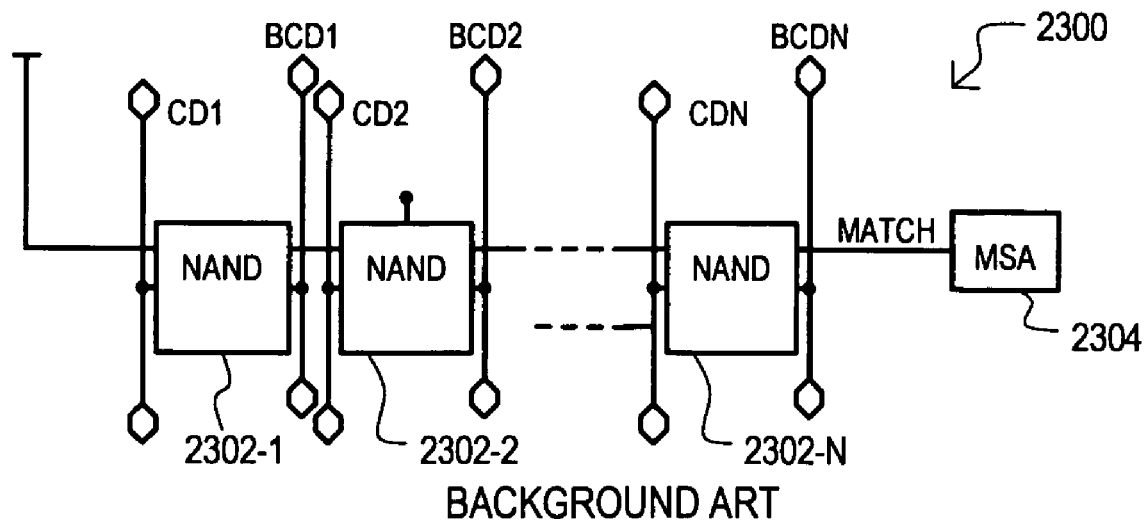
FIG. 23 is a block schematic diagram showing a conventional NAND type CAM match approach.
Figure 24:
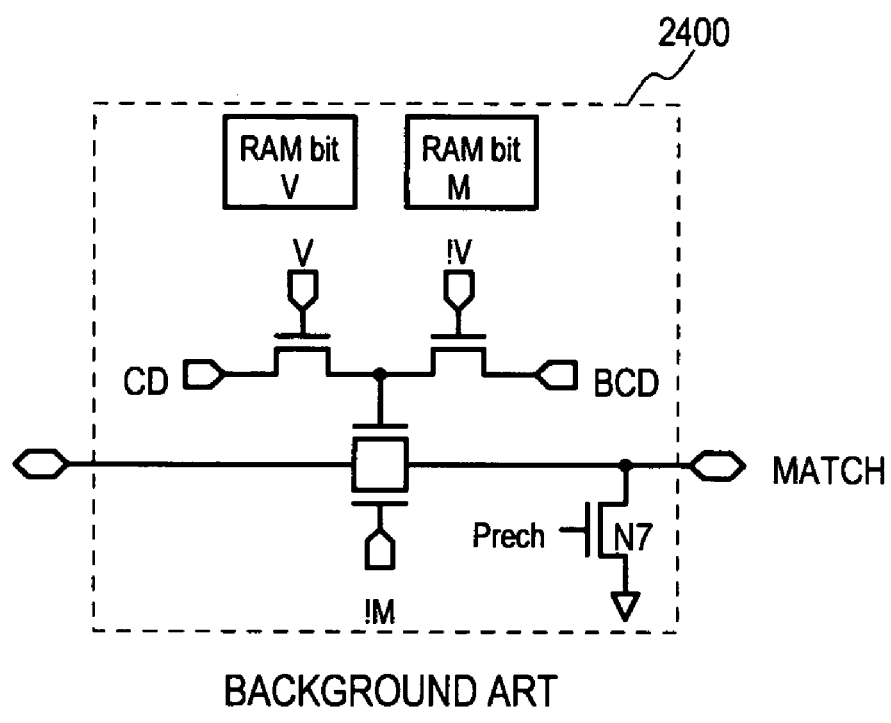
FIG. 24 is a schematic diagram showing an example of a conventional NAND type CAM cell.

FIG. 14 can include the same general sections as FIG. 4. Like sections are labeled with the same reference character but with the first digit being a "14" instead of a "4". The embodiment of FIG. 14 can differ from that of FIG. 4 in that a first storage circuit can be excluded, as there is no need for a mask bit value. Accordingly, a compare circuit 1406-0 can enable or disable a match path transistor T1 according to the function V=CD, and a comparator circuit 1410 can enable or disable comparator transistor T3 according to the function V=1 & CD=0.

Figure 15:
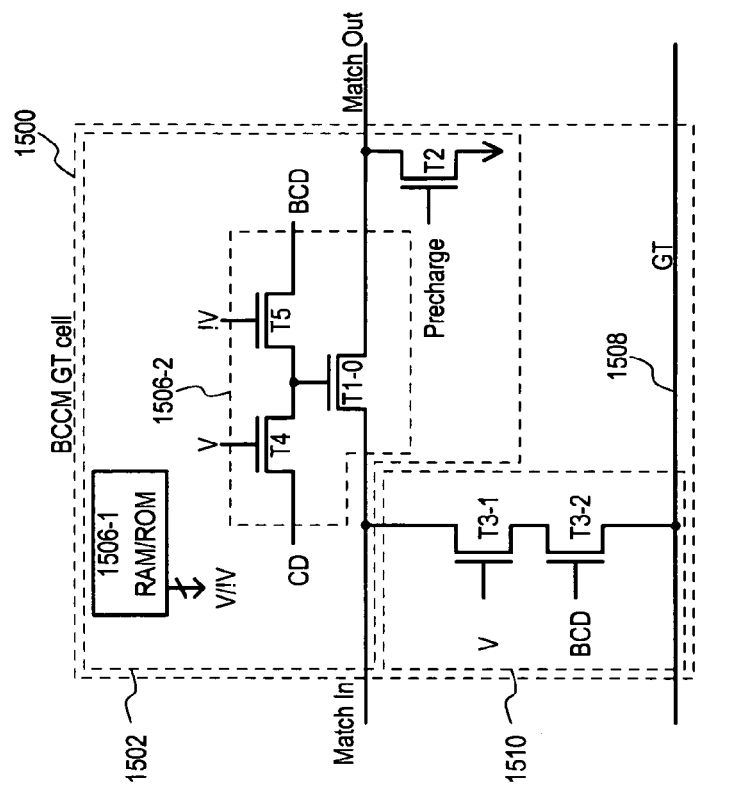

FIG. 15 can include the same general sections as FIG. 5. Like sections are labeled with the same reference character but with the first digit being a "15" instead of a "5". The embodiment of FIG. 15 can differ from that of FIG. 5 in that compare circuit 1506-1 may not include a first storage circuit (506-0) or a transistor T1-1. Similarly, a comparator circuit 1510 may not include a transistor T3-0.

The embodiments of FIGS. 14 and 15 can be used in conjunction with compare logic that described in conjunction with FIG. 6.

More detailed embodiments of a BCCM LT cell will now be described with reference to FIGS. 16 and 17. The embodiments of FIGS. 16 and 17 can be considered related to FIGS. 1–2 and 3F, in that the BCCM cells can be more detailed versions of structures shown in such previous embodiments.

FIG. 16 can include the same general sections as FIG. 14. Like sections are labeled with the same reference character but with the first digit being a "16" instead of a "14". The embodiment of FIG. 16 can differ from that of FIG. 14 in that comparator circuit 1610 can enable or disable comparator transistor T3 according to the function V=0 & CD=1.

FIG. 17 can include the same general sections as FIG. 15. Like sections are labeled with the same reference character but with the first digit being a "17" instead of a "15". The embodiment of FIG. 17 can differ from that of FIG. 15 in that comparator circuit transistors T3-1 and T3-2 can receive a complementary data bit value !V and compare data value CD, respectively.

The present invention may also include or be expressed according to a method. To better understand such method, conventional approaches will first be described. One skilled in the art would recognize that the general flow represent in pseudocode in the following figures could be equivalently created and represented in more formal languages, including but not limited to hardware design languages.

FIG. 18 is a method, in pseudocode form, showing a NOR CAM row operation. In FIG. 18, a match line state is represented by "Match", mask bits are represented by M(I), data bit values are represented by V(I) and a corresponding compare value bits are represented by CompareData(I). FIG. 19 shows a NAND CAM row operation. In FIG. 19, each bit position of a row can generate a match output MatchOut(I) and the total number of bits in a row is Wordwidth.

FIG. 20A-1 describes the operation of a row of CCM cells like that of FIG. 3A. In a precharge state (Precharge), a match output from each CCM can be set to zero, and a greater-than indication (GreaterThan) can be set to zero.

In a compare operation (following the "Else" condition) comparison indications can be made on a bitwise basis. If a mask condition (M(I)=0) exists, or a data bit matches a corresponding compare data bit (V(I)=CompareData(I)), a match signal is allowed to propagate through the CCM cell (MatchOut(I)=MatchOut(I-1)).

In a comparator operation (following the "Else if" condition), provided the bit operation has not been masked (M(I)=1), if a data bit value is greater than the corresponding compare data bit, and a previous CCM is outputting a high value (MatchOut(I-1)=1), a greater-than indication (GreaterThan) can be activated (set to 1 in this case).

Following all bit compare and comparator operations a match indication for the entire row can be the Match Out from a last CCM cell of the row (MatchOut(Wordwidth-1)). FIG. 20A-1 also includes determining if a less-than condition exists based on the match condition and greater-than indication.

FIG. 20A-2 is another representation of a V/M TCCM GT row operation. FIG. 20A-2 can differ from that of FIG. 20A-1 in the comparator operation. Provided the bit operation has not been masked (M(I)=1), if a data bit value is greater than the corresponding compare data bit, a greater-than indication (GreaterThan) can be generated by logically ORing a MatchOut of a previous CCM cell and the current state of GreaterThan.

The remaining figures, FIGS. 20B to 20F describe the operation of a row of CCM cells like those of FIGS. 3B to 3F, respectively. Thus, in the case of FIG. 20B, a LessThan value is initially set to zero, and the argument following the "Else if" includes a less-than determination. In the case of FIGS. 20C and 20D, methods can generally follow that of FIGS. 20A-2 and 20B, respectively, but operates on X/Y bit ternary operations. Finally, the BCCM methods of FIGS. 20E and 20F can generally follow that of FIGS. 20A-2 and 20B, respectively, but do not include a masking function/capability.

Of course, the methods shown in FIGS. 20A-1 to 20F are but particular embodiments, and should not necessarily be construed as limiting to the invention.

It is understood that the embodiments of the invention may be practiced in the absence of an element and or step not specifically disclosed. That is, an inventive feature of the invention can be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A memory device, comprising:
at least one row of content comparator memory (CCM) cells that stores a data value, the row of CCM cells including
a comparator result line commonly coupled to each CCM cell that provides a comparator indication when the data value has a predetermined magnitude with respect to a compare data value, and
a match path formed by a series connection of match signal paths within the CCM cells, each CCM cell placing the respective match signal path in a low impedance state based on at least a data bit value and a corresponding compare data value bit.

2. The memory device of claim 1, further including:
the match path being coupled to a first potential node at one end, and providing the match indication at an opposite end; and
a precharge circuit that selectively couples the comparator result line to a second potential node.

3. The memory device of claim 2, wherein:
the first potential node is a high power supply node; and
the second potential node is a low power supply node.

4. The memory device of claim 1, wherein:
the comparator indication provides a greater-than indication when the stored data value is greater than the compare value.

5. The memory device of claim 1, wherein:
the comparator indication provides a less-than indication when the stored data value is less than the compare value.

6. The memory device of claim 1, wherein:
each CCM cell compares one bit of the stored data value with a corresponding bit of the compare value to provide a bit compare result.

7. The memory device, of claim 6, wherein:
each CCM cell is a ternary CCM cell that places the respective match signal path in a low impedance state based on at least two data bit values and the corresponding compare data value bit.

8. A memory device, comprising:
a plurality of content comparator memory (CCM) cells, each CCM cell comprising
at least a first storage circuit that stores a first data value bit,
a first controllable impedance path arranged in series with an adjacent CCM cell, and
a second controllable impedance path coupled between the first controllable impedance path and a comparator line commonly coupled to the CCM cells.

9. The memory device of claim 8, wherein:
each CCM cell includes
a first bit compare circuit that compares at least the first data bit value and a corresponding compare value bit to generate a first bit compare result, and
the first controllable impedance path is placed into a low impedance state in response to at least the first bit compare result.

10. The memory device of claim 9, wherein:
the first bit compare circuit comprises
a first match transistor having a source-drain path forming at least a portion of the first controllable impedance path,
a second match transistor having a source-drain path coupled to a gate of the first match transistor and a gate coupled to the first storage circuit, and
a third match transistor having a source-drain path coupled to a gate of the first match transistor and a gate coupled to the first storage circuit.

11. The memory device of claim 10, wherein:
each CCM cell further includes
at least a second storage circuit that stores a second data value bit, and
a fourth match transistor having a source-drain path coupled in parallel with the source-drain path of the first match transistor and a gate coupled to the second storage circuit.

12. The memory device of claim 9, wherein:
each CCM cell includes at least a second storage circuit that stores a second data value bit, and
the first bit compare circuit comprises
a first match transistor having a source-drain path forming at least a portion of the first controllable impedance path,
a second match transistor having a source-drain path coupled to a gate of the first match transistor and a gate coupled to the first storage circuit, and
a third match transistor having a source-drain path coupled to gate of the first transistor and a gate coupled to the second storage circuit.

13. The memory device of claim 8, wherein:
each CCM cell further includes a precharge circuit that couples one end of the first controllable impedance path to a voltage node in response to a precharge signal.

14. The memory device of claim 8, wherein:
each second controllable impedance path is placed into a low impedance state based on at least the first data value bit having a predetermined magnitude with respect to a corresponding compare value bit.

15. The memory device of claim 8, wherein:
each second controllable impedance path includes
a first comparator transistor having a gate coupled to the corresponding compare value bit, and
a second comparator transistor having a source-drain path in series with the first comparator transistor and a gate coupled to the first storage circuit.

16. The memory device claim 15, wherein:
each CCM cell further includes
at least a second storage circuit that stores a second data value bit, and
each second controllable impedance path includes a third comparator transistor having a source-drain path in series with the source-drain paths of the first and second comparator transistors, and a gate coupled to the second storage circuit.

17. A method for providing comparator results in a memory device, comprising the steps of:
comparing a different compare value bit with a corresponding data value bit in a corresponding content comparator memory (CCM) cell;
enabling or disabling a match signal path through each CCM memory cell based on at least a matching compare result between the compare value bit and corresponding data value bit; and
enabling or disabling a comparator signal path within each CCM cell between a comparator line and the match signal path based on a predetermined magnitude relationship between the compare value bit and data value bit.

18. The method of claim 17, further including:
arranging the CCM cells in series according to a predetermined significance with respect to one another;
applying a first potential to one end of the match signal path of a most significant CCM cell; and
precharging the comparator line to a second potential prior to comparing the compare value bits with the corresponding data value bits.

19. The method of claim 17, wherein:
the predetermined magnitude relationship is selected from the group consisting of "greater than" and "less than".

20. The method of claim 17, further including:
enabling or disabling the match signal path based on both the compare result between the compare value bit and corresponding data value bit and a mask status for the CCM cell; and
enabling or disabling a comparator signal path based on the predetermined magnitude relationship between the compare value bit and data value bit and also the mask status for the CCM cell.

* * * * *